(12) United States Patent
Kojima

(10) Patent No.: US 6,988,609 B2
(45) Date of Patent: Jan. 24, 2006

(54) WORK MEASUREMENT APPARATUS

(75) Inventor: Tomoyuki Kojima, Tokyo-To (JP)

(73) Assignee: Tokyo Weld Co., Ltd., Tokyo-To (JP)

( * ) Notice: Subject to any disclaimer, the term of this patent is extended or adjusted under 35 U.S.C. 154(b) by 113 days.

(21) Appl. No.: 10/784,195

(22) Filed: Feb. 24, 2004

(65) Prior Publication Data

US 2004/0163927 A1    Aug. 26, 2004

(30) Foreign Application Priority Data

Feb. 25, 2003   (JP) .............................. 2003-047149

(51) Int. Cl.
| | |
|---|---|
| B21B 39/00 | (2006.01) |
| B23B 13/00 | (2006.01) |
| B23D 47/04 | (2006.01) |
| B23Q 5/22 | (2006.01) |
| B23Q 7/00 | (2006.01) |

(52) U.S. Cl. .................. 198/339.1; 198/340; 324/758
(58) Field of Classification Search ............ 198/339.1, 198/340, 393, 803.14; 324/537, 750, 754, 324/758

See application file for complete search history.

(56) References Cited

U.S. PATENT DOCUMENTS

| | | | | |
|---|---|---|---|---|
| 5,929,649 | A  * | 7/1999 | Cramer ....................... | 324/761 |
| 6,384,618 | B1 * | 5/2002 | Pursel et al. ................ | 324/765 |
| 6,512,362 | B1 * | 1/2003 | Gieser ........................ | 324/758 |
| 6,531,774 | B1 * | 3/2003 | Do et al. .................... | 324/758 |

* cited by examiner

Primary Examiner—Gene O. Crawford
(74) Attorney, Agent, or Firm—Birch, Stewart, Kolasch & Birch, LLP

(57) ABSTRACT

A work measurement apparatus 1 comprises a base 2 and a conveyor table 3 which is slidably disposed on the base 2 and includes a work receiving opening 6. A guide plate 4 is fixedly disposed on the conveyor table 3. A guide entrance 5 is disposed in the guide plate 4 at the upper end of the work receiving opening 6. A measurement probe 8 is disposed on the upper side of the guide plate 4. The measurement probe 8 is urged towards the work W in the work receiving opening 6. The measurement probe 8 slides on the guide plate 4 as the conveyor table 3 is rotated. The measurement probe 8 is then directed by the guide entrance 5 to the work W in the work receiving opening 6 and makes contact with the work W. The measurement probe 8 exits from the guide entrance 5.

9 Claims, 4 Drawing Sheets

WORK MEASUREMENT APPARATUS

This Nonprovisional application claims priority under 35 U.S.C. § 119(a) on Patent Application No(s). 2003-047149 filed in JAPAN on Feb. 25, 2003, the entire contents of which are hereby incorporated by reference.

FIELD OF THE INVENTION

The present invention relates to a work measurement apparatus for receiving a work in a receiving opening and conveying the work, and more specifically to a work measurement apparatus that can reduce the occurrence of problems caused by friction between a probe and an electrode of the work, such as scoring of the electrode or an edge of the electrode breaking off.

RELATED ART

In a conventional apparatus for conveying and measuring a work, the work is loaded into a conveyor in which a conveyor body is slightly thinner than the length of the work, such that the work is loaded lengthwise in a direction of an electrode. A probe makes contact with the work as the work is conveyed by the conveyor. In this case, since the work is being measured as it is being moved, damage to the electrodes has occurred, such as scoring damage to an electrode surface due to rubbing of the probe against the surface of the electrode, or the loss of a part of the electrode due to the probe striking against the protruding work.

FIG. 6 is an enlarged cross-sectional lengthwise diagram of the conventional work measurement apparatus, while FIG. 7 shows scoring marks on an electrode of a work during a characteristic measurement of the work. A work measurement apparatus 20 shown in FIG. 6 has a conveyor body consisting of a conveyor table 3 rotatably displaced on a base 2. A plurality of work receiving openings 6 are arranged concentrically in the conveyor table 3 at regular intervals.

FIG. 6 shows that the work receiving openings 6 penetrate through the conveyor table 3 and receive the works W. On the front and rear surfaces of the conveyor table 3 (hereinafter the front surface is the "upper side" and the rear surface is the "lower side") are the respective electrode end surfaces t, ta of the work W. The work W is conveyed as the conveyor table 3 rotates intermittently in the direction of an arrow.

A base probe 7 is disposed to face a work conveyor surface 2a of the base 2. The base probe 7 penetrates through the base 2 and is insulated from the base 2 by an insulation layer 7a. A measurement probe 8 is disposed opposite the base probe 7 so that the work W inside the work receiving opening 6 is clamped between the measurement probe 8 and the base probe 7. The measurement probe 8 is attached to a probe holder (not shown) to move up and down on a central fulcrum. The measurement probe 8 is urged toward the conveyor table 3 by an elastic member (not shown) attached to the probe holder.

The entire surface of a contact surface 8a of the measurement probe 8 is formed at an appropriate angle to make contact with the electrode end surface t. The measurement probe 8 is urged towards the work W in the conveyor table 3 in such a way that an appropriate contact pressure is exerted on the work W between the measurement probe 8 and the base probe 7.

In the work measurement apparatus 20, when the conveyor table 3 moves in the direction shown by the arrow, the upper electrode end surface t of the work W protrudes slightly above the conveyor table 3, and the contact surface 8a of the measurement probe 8 runs over the upper electrode end surface t of the work W. At a measurement position, the measurement is carried out as the contact surface 8a of the measurement probe 8 grazes the upper electrode end surface t.

After the measurement process is completed, the contact surface 8a of the measurement probe 8 continues to graze the upper electrode end surface t of the work W as the work W is being conveyed, after which the work W is discharged from the measurement position. As a result of this process, as shown in FIG. 7, the upper electrode end surface t of the discharged work W can be damaged by scoring 15 caused by the grazing action of the contact surface 8a, and either the quality of the work W may be reduced or the work W may not be fit to be used at all.

Furthermore, due to the grazing of the contact surface 8a of the measurement probe 8 on the upper electrode end surface t of the work W, a large amount of oxidized film residue is scratched off the upper electrode end surface t and becomes attached to the contact surface 8a, which increases contact resistance and lowers measurement precision.

In cases where a speed of the measuring process is increased, due to the increased speed of the conveyor table 3 (i.e. the speed of the work W), the impact of the electrode end surface t with the measurement probe 8 intensifies, and the electrode edges can be broken off.

SUMMARY OF THE INVENTION

An object of the present invention is to provide a work measurement apparatus in which scoring on the electrode and breaking off of the same can be prevented during the measurement process.

A work measurement apparatus according to the present invention comprises a conveyor with a work receiving opening, and a pair of probes disposed on front and rear sides of the conveyor to make contact with a work, the work receiving opening penetrating through the conveyor and at least one end of the work receiving opening having a guide entrance, the work being received within the work receiving opening, and at least one of the probes being urged towards the work in the work receiving opening, said probe being guided by the guide entrance to enter into the work receiving opening, make contact with the work and exit the work receiving opening via the guide entrance.

The conveyor may be formed as one part made of an electrical insulation material.

The conveyor may have a conveyor body, and a guide plate which is disposed on the conveyor body and includes the guide entrance.

The guide plate may be made of an electrically conductive material.

The guide plate may be made of an insulative material.

A base may be placed opposite to the conveyor, and the other of the probes may be a base probe disposed on the base.

The conveyor may comprise a rotatable table.

The conveyor may comprise a belt.

The guide entrance may have a size larger than that of the work receiving opening.

PREFERRED EMBODIMENTS OF THE INVENTION

Embodiments of the invention will be explained below with reference to the drawings, beginning with FIGS. 1 and 2, which show a first embodiment of a work measurement apparatus 1 of the present invention.

Figure 1:
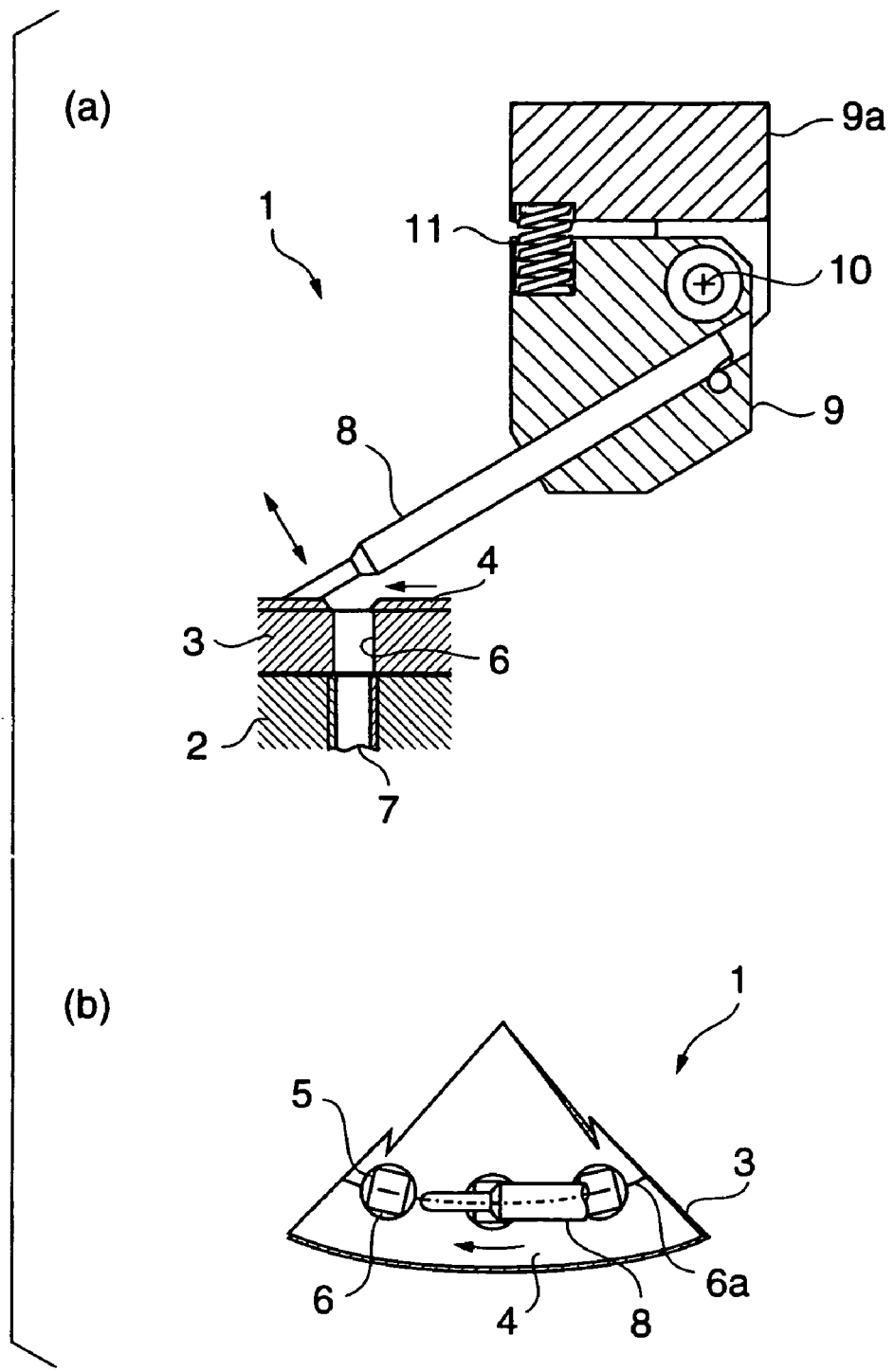
FIGS. 1(a)–(b) show a work measurement apparatus according to a first embodiment of the invention.
Figure 2:
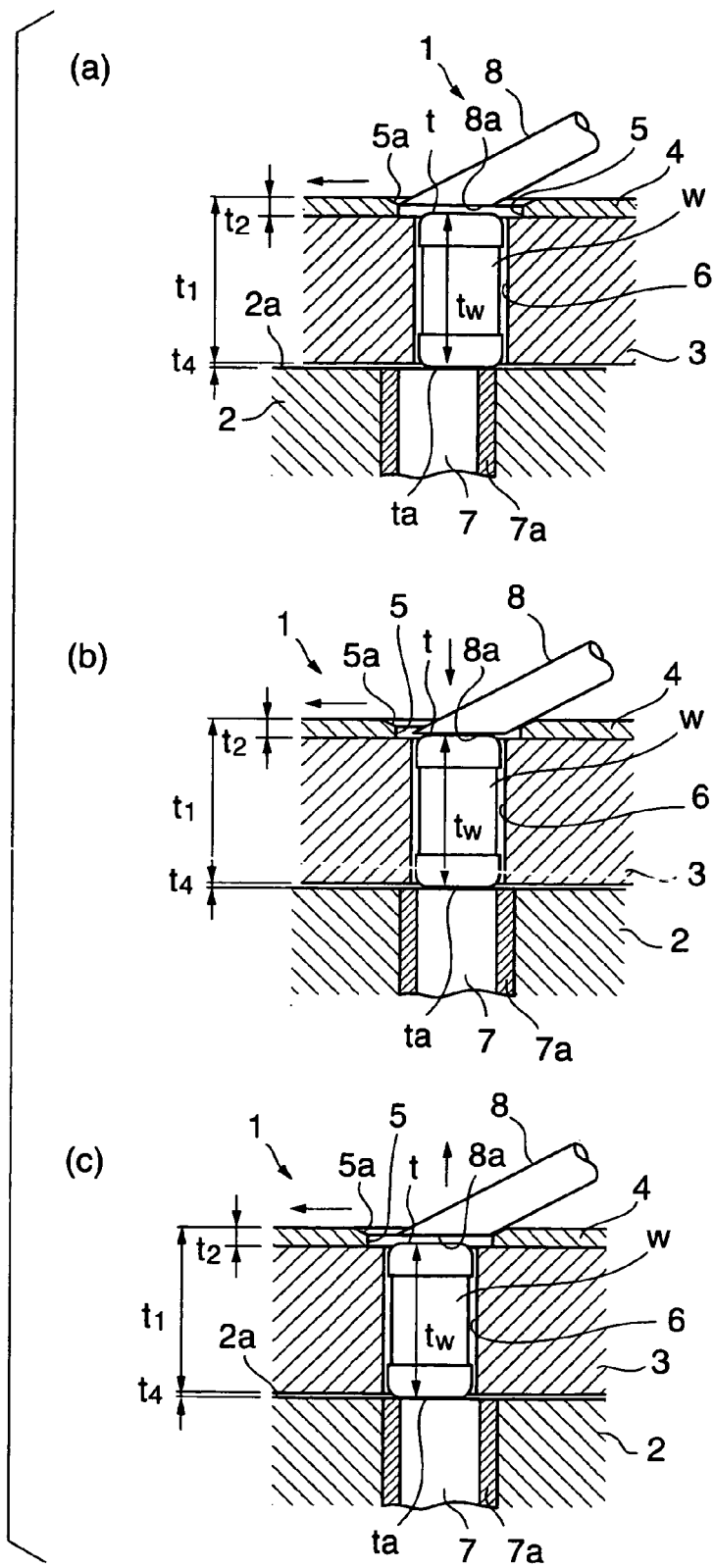
FIGS. 2(a)–(c) show operations of the first embodiment illustrated in FIG. 1.

In FIGS. 1(*a*) (*b*) and 2(*a*)–(*c*), the work measurement apparatus 1 has a conveyor table 3 which rotates on a base 2.

A circular guide plate 4 is disposed on the conveyor table 3. The conveyor table 3 (conveyor body) and the guide plate 4 constitute a conveyor. The conveyor 3, 4 has a plurality of work receiving openings 6 arranged concentrically at fixed intervals. The work receiving openings 6 form a work receiving opening row 6*a*. In this embodiment, each work receiving opening 6 penetrates through the conveyor 3, 4.

A guide entrance 5 is disposed within the guide plate 4 at the upper end part of the work receiving opening 6. The purpose of the guide entrance 5 is to lead a measurement probe 8 into the work receiving opening 6. Edges of the guide entrance 5 are formed of a sloping guide surface 5*a*.

Each work receiving opening 6 receives a work W in such a way that the work W is loaded inside and below an upper surface of the work receiving opening 6.

The work receiving opening 6 receives the work W, which has an upper electrode end surface t on an upper side of the work W and a lower electrode end surface ta on a lower side of the work W. The conveyor 3, 4 rotates the work intermittently in the direction shown by an arrow. A base probe 7*a* is disposed on the base 2, and is insulated from the base 2 by an insulation layer 7*a*. A work conveyor surface 2*a* of the base 2 faces an upper surface of the base probe 7, while the base probe 7 penetrates through the base 2.

A measurement probe 8 is provided opposite to the base probe 7 so that the work W in the work receiving opening 6 is clamped between the measurement probe 8 and the base probe 7. The measurement probe 8 is secured by a probe holder 9, which is rotatably supported by a fixed probe holder part 9*a* through a support point 10, enabling the measurement probe 8 to move towards and separate from the conveyor 3, 4. An elastic member 11 is provided between the probe holder 9 and the fixed probe holder part 9*a*. The elastic member 11 enables the measurement probe 8 to be urged towards the conveyor table 3, 4.

The circular guide plate 4 covers and is fixedly attached to the conveyor table 3. Guide entrances 5 are provided in the guide plate 4 for each work receiving opening 6. The sides of the guide entrances 5 are tapered to form the sloping guide surface 5*a*. The guide entrance 5 is formed slightly larger than the contact surface 8*a* of the measurement probe 8. The guide entrance 5 guides the measurement probe 8 into the work receiving opening 6, where the contact surface 8*a* of the measurement probe 8 makes contact with the upper electrode end surface t of the loaded work W.

Next will be explained the measurement methods and conditions for measuring the work W. The electrode end surfaces t, ta of the work W are not contacted by the probes 7, 8 while the work W is being conveyed, but the electrode end surfaces t, ta are contacted by the probes 7, 8 at the time of measurement. In this case, the following is true: $t_1+t_4-t_2<t_w<t_1+t_4$.

$t_1$: a thickness of the conveyor 3, 4
$t_2$: a thickness of the guide plate 4
$t_4$: a space between the conveyor 3, 4 and the base 2
$t_w$: a distance between the electrode end surfaces t, ta of the work W The guide entrance 5 is formed larger than the work receiving opening 6.

Operation of the work measurement apparatus 1 comprising the above parts will now be explained.

In FIG. 1(*a*), the conveyor table 3 and the guide plate 4, which comprise the conveyor, rotate in the direction shown by the arrow. The measurement probe 8 is urged towards the guide plate 4 by the elastic member 11, and the contact surface 8*a* of the measurement probe 8 is moved relative to the surface of the guide plate 4. When the contact surface 8*a* of the measurement probe 8 reaches the guide entrance 5 of the guide plate 4, a tip of the measurement probe 8 is guided by the sloping guide surface 5*a* to enter the guide entrance 5, as shown in FIG. 2(*a*). When the conveyor table 3 and the guide plate 4 rotate further, the tip of the measurement probe 8 releases from the sloping guide surface 5*a*, and the contact surface 8*a* of the measurement probe 8 makes contact with the top of the upper electrode end surface t of the work W, as shown in FIG. 2(*b*).

After the contact surface 8*a* makes contact with the upper electrode surface t, the conveyor table 3 rotates slightly so that the contact surface 8*a* is centered in the work receiving opening 6. The conveyor table 3 then stops momentarily while the contact surface 8*a* of the measurement probe 8 and the base probe 7 clamp the work W and carry out various measurements of the work W.

During this measurement process, the contact surface 8*a* of the measurement probe 8 is positioned such that the contact surface 8*a* is parallel with the upper electrode end surface t when the same make contact. This feature ensures a favorable contact condition between the contact surface 8*a* and the upper electrode end surface t and an appropriate level of contact pressure by the elastic member 11 towards the work W clamped between the measurement probe 8 and the base probe 7.

The conveyor table 3 and the guide plate 4 rotate again after completion of the measurement process. FIG. 2(*c*) shows that the measurement probe 8 is pushed upward by the sloping guide surface 5*a*. The contact surface 8*a* of the measurement probe 8 is then separated from the upper electrode end surface t and rubs over the surface of the guide plate 4 and goes to the next guide entrance 5.

In the first embodiment, the contact surface 8*a* of the measurement probe 8 makes contact with the upper electrode end surface t of the work W only during the time of measurement. This reduces friction between the contact surface 8*a* of the measurement probe 8 and the upper electrode end surface t and consequently reduces wear on the work W to a minimal level while also preventing the chipping off of the electrode of the work W. Furthermore, when the size of a work W changes, typically the conveyor table 3 must be changed to one with suitably sized work receiving openings 6. In this case, as long as the largest work W is smaller than the guide entrance 5, there is no need to change the measurement probe 8, and therefore a common guide plate 4 can be used. The contact condition is favorable because there is a small amount of rubbing from the time of contact between the contact surface 8a of the probe 8 and the upper electrode end surface t, which allows the oxidized layer on the upper electrode end surface t to be rubbed away. The small amount of oxidized material that might be adhered to the contact surface 8a is cleaned off when the contact surface 8a rubs against the surface of the guide plate 4, thereby keeping the contact surface 8a of the probe 8 clean.

The guide plate 4 may be made of either electrically conductive or insulative materials. In the case where an electrically conductive material is used for the guide plate 4, the guide plate 4 can have an electrostatic shielding effect. In the case where an insulative material is used for the guide plate 4 there is no electrostatic shielding effect, but the guide plate 4 has superior insulative qualities. The material for the guide plate 4 can be chosen according to the merits the material brings for the work W being measured. If the work W is a condenser subjected to high-frequency measurement, then an electrically conductive material would be chosen for the guide plate 4. If the work W is a resistor or condenser to be subjected to insulative resistance measurement, then an insulative material would be preferable for the guide plate 4.

Further embodiments of the work measurement apparatus 1 will be described by FIGS. 3–5.

Figure 3:
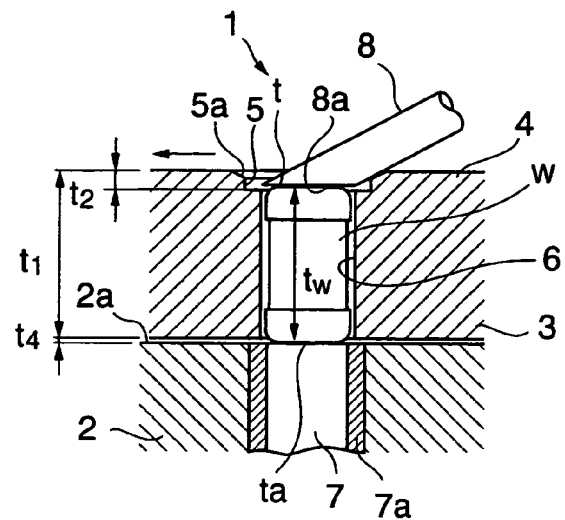
FIG. 3 shows the work measurement apparatus according to a second embodiment of the invention.
Figure 4:
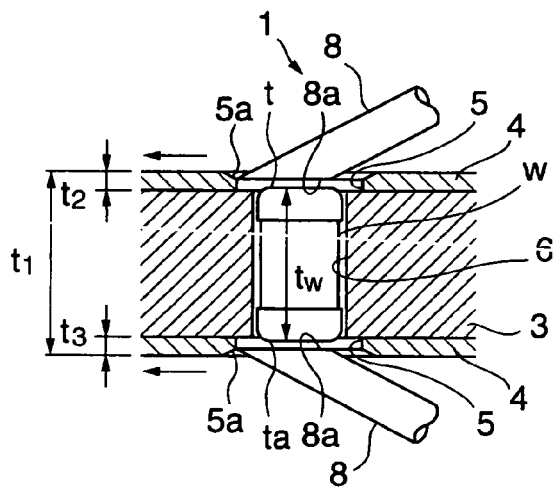
FIG. 4 shows the work measurement apparatus according to a third embodiment of the invention.

In FIG. 3, instead of using the guide plate 4, the conveyor table 3 is thickened by an amount corresponding to the thickness of the guide plate 4 on the upper side. The guide entrance 5 and the sloping guide surface 5a are provided directly in the thickened area of the conveyor table 3. The same reference numerals for the same portions used in FIGS. 1–2 are applied to FIG. 3, and therefore detailed descriptions of the portions are omitted. In the embodiment of FIG. 3, the material used for the conveyor table 3 is limited to an insulative material and the conveyor consists solely of the conveyor table 3.

In FIG. 3, the conveyor table 3 is thickened, on the upper side, to the amount corresponding to the guide plate 4 ($t_2$) of the first embodiment.

The third embodiment of the work measurement apparatus will be explained using FIG. 4. In FIG. 4, movable measurement probes 8 are provided on both the upper and lower sides of the conveyor table 3. Fixed guide plates 4 are disposed on both sides of the conveyor table 3, and each guide plate 4 has guide entrances 5 with the sloping guide surface 5a. The movable measurement probes 8 are arranged to enter each guide entrance 5.

In the third embodiment, the following is true of the measurement condition: $t_1=t_2=t_3<t_w<t_1$ $t_1$: the thickness of the conveyor 3, 4

$t_2$: $t_3$: a thickness of the guide plate 4

$t_4$: a space between the conveyor 3, 4 and the base 2

$t_w$: a distance between the electrode end surfaces t, ta of the work W

Figure 5:
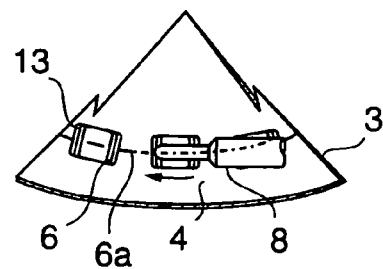
FIG. 5 shows the work measurement apparatus according to a fourth embodiment of the invention.
Figure 6:
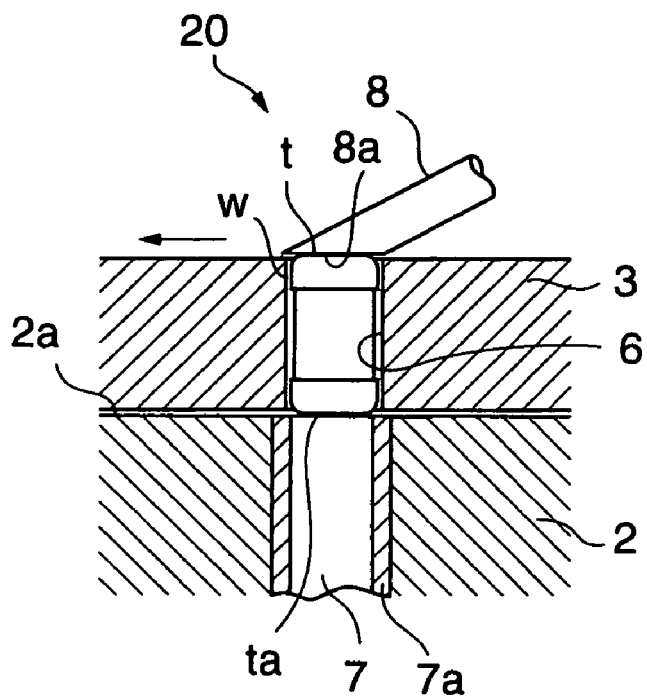
FIG. 6 shows a conventional work measurement apparatus.
Figure 7:
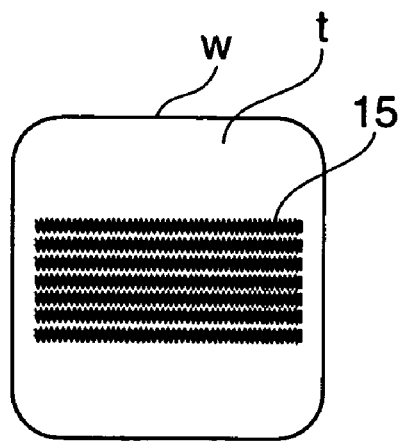
FIG. 7 shows scoring on an end of an electrode of a work.

A forth embodiment is shown in FIG. 5. In the first embodiment of FIG. 1, the guide entrance 5 is circular, but in the fourth embodiment, the guide entrance 5 may be an angular shape.

In the embodiments explained above, the conveyor consists of the base 2 and the conveyor table 3 that rotates on top of the base 2. It is also possible, however, to use a long and straight conveyor such as a belt conveyor or a carrier tape instead of the conveyor table.

In the conveyor table 3, the electrode end surfaces t, ta of the work W are arranged vertically in a horizontal direction, but the electrode end surfaces t, ta may also be positioned perpendicularly or on a slant.

The work receiving openings 6 are provided inside the edge of the conveyor 3, 4 in the embodiments (see FIG. 1(b)), but the work receiving openings 6 may also be positioned on the outer edge of the conveyor 3, 4 to open outwardly. In this case, the work receiving openings 6 would have a U shape as viewed from the top, and the guide entrance 5 corresponding to the work receiving openings 6 of the U shape could have the same shape or be circular.

The work measurement apparatus described above reduces the occurrence of scoring and wear on the electrodes and prevents the breaking off of the electrodes of the work by limiting as much as possible the distance over which the probe rubs the top of the work. The probe rubs against the top of the work only minimally, and therefore less oxidized material adheres to the probe, while the oxidized material is then eliminated from the end of the probe when the probe rubs over the conveyor. This allows the probe and the work to maintain a good contact condition.

What is claimed is:

1. A work measurement apparatus, comprising
a conveyor with a work receiving opening, and
a pair of probes disposed on front and rear sides of the conveyor to make contact with a work,
the work receiving opening penetrating through the conveyor and at least one end of the work receiving opening having a guide entrance,
the work being received within the work receiving opening, and
at least one of the probes being urged towards the work in the work receiving opening, said probe being guided by the guide entrance to enter into the work receiving opening, make contact with the work and exit the work receiving opening via the guide entrance.

2. The work measurement apparatus according to claim 1, wherein
the conveyor is formed as one part made of an electrical insulation material.

3. The work measurement apparatus according to claim 1, wherein
a base is placed opposite to the conveyor, and the other of the probes is a base probe disposed on the base.

4. The work measurement apparatus according to claim 1, wherein
the conveyor comprises a rotatable table.

5. The work measurement apparatus according to claim 1, wherein
the conveyor comprises a belt.

6. The work measurement apparatus according to claim 1, wherein
the guide entrance has a size larger than that of the work receiving opening.

7. The work measurement apparatus according to claim 1, wherein
the conveyor has a conveyor body, and a guide plate which is disposed on conveyor body and includes the guide entrance.

8. The work measurement apparatus according to claim 7, wherein
the guide plate is made of an electrically conductive material.

9. The work measurement apparatus according to claim 7, wherein
the guide plate is made of an insulative material.

* * * * *